(12) United States Patent
Alphonse

(10) Patent No.: US 6,829,276 B1
(45) Date of Patent: Dec. 7, 2004

(54) INTEGRATED HIGH POWER SEMICONDUCTOR LASER

(75) Inventor: Gerard Argant Alphonse, Princeton, NJ (US)

(73) Assignee: Trumpf Photonics, Inc., Cranbury, NJ (US)

( * ) Notice: Subject to any disclaimer, the term of this patent is extended or adjusted under 35 U.S.C. 154(b) by 0 days.

(21) Appl. No.: 09/571,970

(22) Filed: May 16, 2000

Related U.S. Application Data

(60) Provisional application No. 60/161,213, filed on Oct. 22, 1999.

(51) Int. Cl.[7] .................................. H01S 5/00
(52) U.S. Cl. ...................... 372/47; 372/43; 372/44; 372/45; 372/46; 372/48; 372/49; 372/50
(58) Field of Search .................. 372/43–50, 47, 372/92, 26

(56) References Cited

U.S. PATENT DOCUMENTS

| | | | | |
|---|---|---|---|---|
| 3,624,544 A | * | 11/1971 | De Maria et al. | 372/18 |
| 5,278,926 A | | 1/1994 | Doussiere | |
| 5,673,284 A | | 9/1997 | Congdon et al. | |
| 5,761,226 A | * | 6/1998 | Gupta | 372/22 |
| 6,034,380 A | * | 3/2000 | Alphonse et al. | 257/94 |
| 6,174,748 B1 | * | 1/2001 | Jeon et al. | 372/45 |
| 6,240,224 B1 | * | 5/2001 | Reekie et al. | 385/37 |
| 6,253,009 B1 | | 6/2001 | Lestra et al. | |
| 6,275,627 B1 | * | 8/2001 | Wu | 385/28 |
| 6,339,606 B1 | * | 1/2002 | Alphonse | 372/50 |
| 6,363,188 B1 | * | 3/2002 | Alphonse | 385/123 |
| 6,373,868 B1 | * | 4/2002 | Zhang | 372/19 |

FOREIGN PATENT DOCUMENTS

| | | |
|---|---|---|
| EP | 0908959 | 4/1999 |
| EP | 1005120 A | 5/2000 |

OTHER PUBLICATIONS

Doussier, P. et al., "Clamped gain traveling wave semiconductor optical amplifier for wavelength division multiplexing applications," Proceedings of the 14th International Semiconductor Laser Conference, Maui, Hawaii, pp. 185–186, (1994).

Jeon et al., "High power narrow divergence DFB laser diode at 1.55$\mu$m," Electronics Letters, IEE Stevenage, GB, vol. 34, No. 13, pp. 1313–1315, (1998).

Patent Abstracts of Japan, vol. 009, No. 019, (E–292),JP 59 165481, (1985).

Patent Abstracts of Japan, vol. 012, No. 085,(E–591), JP 62 221182, (1988).

* cited by examiner

*Primary Examiner*—Paul Ip
*Assistant Examiner*—Delma R. Flores-Ruiz
(74) *Attorney, Agent, or Firm*—Fish & Richardson P.C.

(57) ABSTRACT

A single-transverse-mode laser has a resonance cavity with an output end. A gain medium is disposed within the resonance cavity. The gain medium portion includes an active portion. A mode expander portion is disposed within the resonance cavity and operationally coupled to the gain medium portion and the output end of the resonance cavity. A single-mode waveguide portion is disposed with the resonance cavity between and operationally coupled to the mode expander portion of the output end of the resonance cavity. The single-mode waveguide portion is a passive portion. The gain medium portion, the mode expander portion and the single-mode waveguide portion are integrally formed.

17 Claims, 6 Drawing Sheets

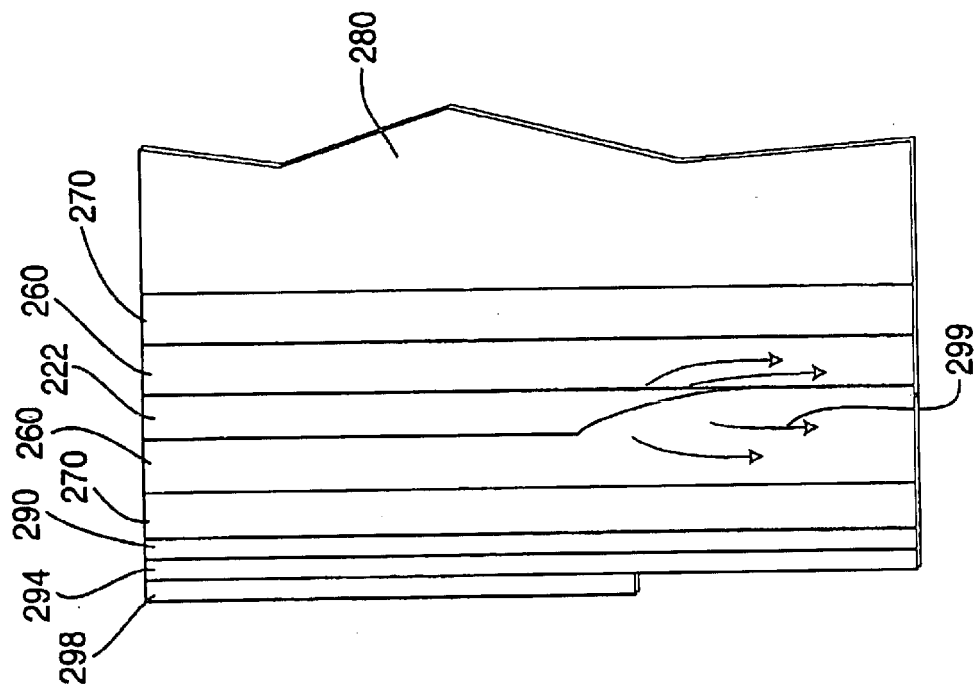
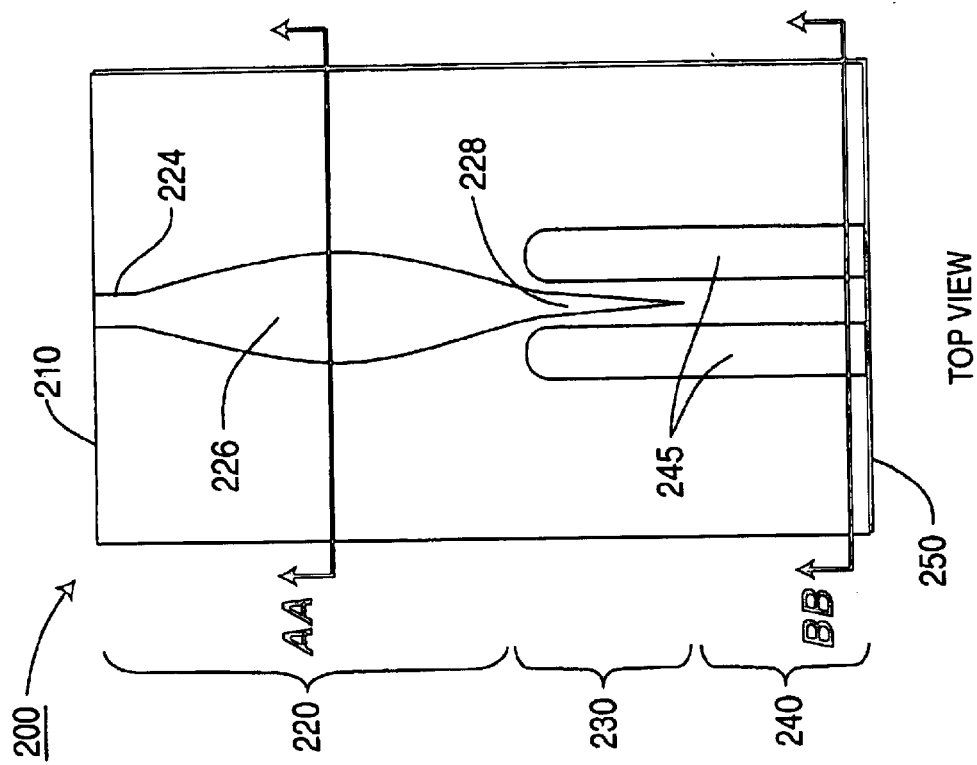

TOP VIEW

SIDE VIEW

TOP VIEW

SIDE VIEW

INTEGRATED HIGH POWER SEMICONDUCTOR LASER

CO-PENDING RELATED APPLICATIONS

The present application claims priority to co-pending provisional application, U.S. Ser. No. 60/161,213 filed on Oct. 22, 1999, entitled "Integrated High Power Semiconductor Laser".

The present application is related to the application entitled "Mode Expander with Co-directional Grating" application Ser. No. 09/571,211 by the same inventor, filed on the same day and which is incorporated herein by reference.

BACKGROUND

The present invention relates generally to lasers. More specifically, the present invention relates to an integrated high-power semiconductor laser.

Telecommunications is a large and fast growing industry. This growth has been enabled, at least in part, by the use of optical amplifiers to extend the range of long-haul optical transmission and by the deployment of Dense Wavelength Division Multiplexing (DWDM) systems to increase the optical channel capacity. These technologies have been improved by extending the bandwidth of Erbium-Doped Fiber Amplifier (EDFA) optical amplifiers from about 20 nm to about 80 nm.

A technical challenge in extending the bandwidth of EDFAs has been the need to provide enough gain in the EDFAs over the entire bandwidth. This can be accomplished by single-mode 980 nm or 1480 nm laser pumps with output powers on the order of 1 Watt or more. Known laser pumps for EDFAs are single-mode semiconductor narrow-stripe pump lasers limited to about 150 mW in a single-mode fiber. This limitation is due to catastrophic optical damage that can occur if the optical power density at the facet of the laser exceeds about 1 to $2 \times 10^7$ W/cm$^2$ and due to the fact that stripe laser is narrow (e.g., 3–5 $\mu$) to ensure single-mode operation.

To overcome the limitation relating to the optical power density, the cross-section area of the laser's active region must be widened to reduce the power density in the laser stripe (i.e., the active region), especially at the facet of the laser. Widening the cross-section area of the laser's active region, however, conflicts with the design constraint of single-mode operation. Thus, a need exists to extend the output power of laser pumps for EDFAs beyond the current limit (i.e., 150 mW) by widening the cross-sectional area of the laser while maintaining single-mode operation.

SUMMARY OF THE INVENTION

A single-transverse-mode laser has a resonance cavity with an output end. A gain medium portion is disposed within the resonance cavity. The gain medium portion includes an active portion. A mode expander portion is disposed within the resonance cavity between and operationally coupled to the gain medium portion and the output end of the resonance cavity. A single-mode waveguide portion is disposed with the resonance cavity between and operationally coupled to the mode expander portion and the output end of the resonance cavity. The single-mode waveguide portion is a passive portion. The gain medium portion, the mode expander portion and the single-mode waveguide portion are integrally formed.

BRIEF DESCRIPTION OF THE INVENTION

FIG. 2 illustrates a top view of an integrated laser, according to an embodiment of the present invention.

FIG. 3 illustrates a side view of the integrated laser shown in FIG. 2.

DETAILED DESCRIPTION

Figure 1:
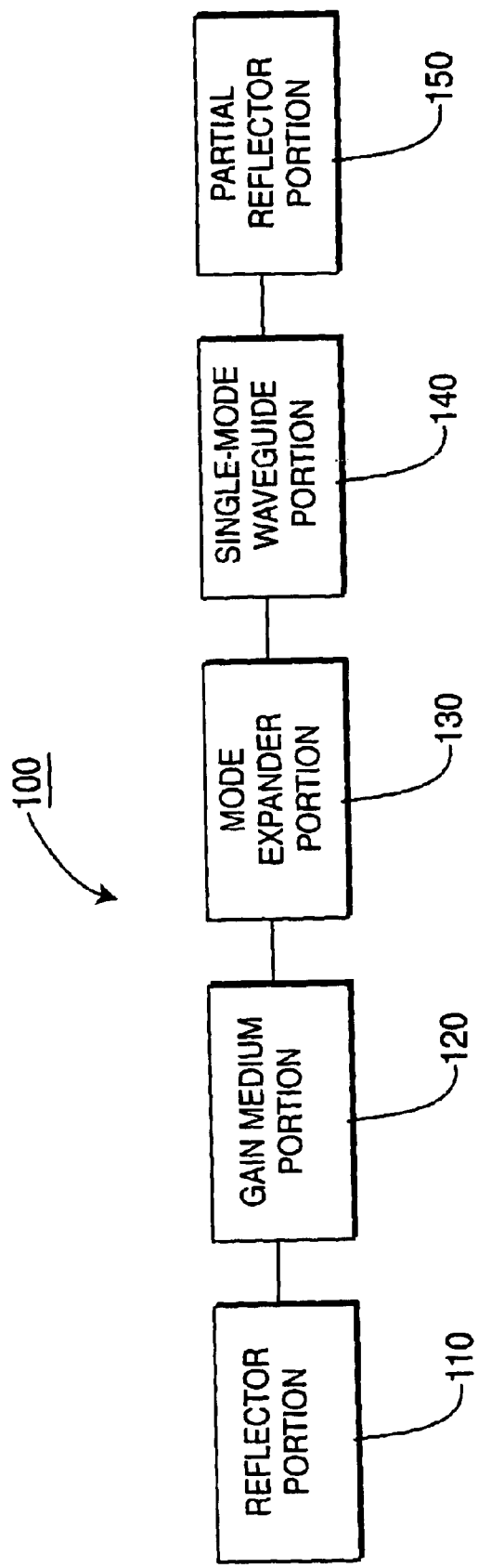
FIG. 1 illustrates a system block diagram of an integrated laser, according to an embodiment of the present invention.

A single-transverse-mode laser has a resonance cavity with an output end. A gain medium portion is disposed within the resonance cavity. The gain medium portion includes an active portion. A mode expander portion is disposed within the resonance cavity between and operationally coupled to the gain medium portion and the output end of the resonance cavity. A single-mode waveguide portion is disposed with the resonance cavity between and operationally coupled to the mode expander portion and the output end of the resonance cavity. The single-mode waveguide portion is a passive portion. The gain medium portion, the mode expander portion and the single-mode waveguide portion are integrally formed.

In one embodiment, the gain medium portion can have an active region that produces relatively high power (e.g., higher power than that produced by a stripeshaped active region). The mode expander portion can transfer light from the gain medium portion to the single-mode waveguide portion: the portion of the single-mode waveguide portion in which light propagates can have a higher cross-sectional area than the portion of the gain medium portion in which light propagates.

Such an example of an embodiment illustrates many possible advantages over known lasers with, for example, stripe-shaped active regions. Because the requirements to achieve population inversion limits the allowable thickness of an active region of a laser, the cross-sectional area of an output beam of a typical laser is limited. In this example of an embodiment of the present invention, however, the mode-expander portion and the single-mode waveguide portion allow the output beam to have a larger cross-sectional area with a more circular cross-sectional shape while still maintaining single-mode light (i.e., outputting light in the fundamental mode without higher order modes).

Consequently, the relatively high-power light generated by the gain medium portion has a reduced power density at the facet of the output end of the integrated laser (i.e., the output facet) which can prevent possible damage to integrated laser at the output facet which could otherwise occur due to the relatively high power produced by the gain medium portion. In addition, the more circular shape of the output beam shape is, for example, comparable to the mode diameter of a single-mode fiber pigtail for an erbium-doped fiber amplifier (EDFA) pumping applications. Thus, fiber coupling efficiency can be high and coupling can be performed with minimum optical devices. In some instances, the integrated laser can be directly coupled to a single-mode fiber pigtail without any intervening coupling optical devices (e.g., cylindrical lens as can be otherwise necessary with a stripe-shaped active region that produces an output beam with a narrow oval cross-sectional shape).

The term "coupled" is used herein to include, but is not limited to, two components being associated such that energy sent by one component is received by the other component. Where the components are optical components sending and receiving light, the optical components can be connected, for example, by their physical arrangement so that one component sends light along an optical path and the other component receives the light along that path. Alternatively, optical components can be connected, for example, by an optical fiber(s), fiber-coupling device(s) and/or collimator(s) as appropriate, to maximize the light sent and received. Where the components are electronic components, they can be coupled by, for example, conventional wiring.

FIG. 1 illustrates a system block diagram of an integrated laser, according to an embodiment of the present invention. The integrated laser 100 includes reflector portion 110, gain medium portion 120, mode expander portion 130, single-mode waveguide portion 140 and partial reflector portion 150. Reflector portion 110, gain medium portion 120, mode expander portion 130, single-mode waveguide portion 140 and partial reflector portion 150 are integrally formed, for example, of semiconductor materials by, for example, epitaxal growth. Gain medium portion 120 is disposed between and operationally coupled to reflector portion 110 and mode expander portion 130. Single-mode waveguide portion is disposed between and operationally coupled to mode expander portion 130 and partial reflector portion 150.

Reflector portion 110 and partial reflector portion 150 define a resonance cavity of the integrated laser 100. In other words, light is generated within the integrated laser 100, for example in the gain medium portion 120 discussed below. This light is reflected within the resonance cavity, i.e., between the reflector portion 110 and partial reflector portion 150. Reflector portion 110 can have a reflectivity of, for example, greater than 95%; partial reflector portion 150 can have a reflectivity of, for example, 3% to 5%. Thus, most of the light propagating within the resonance cavity and towards the reflector portion 110 is reflected by the reflector portion 110; some portion of the light propagating within the resonance cavity and towards the partial reflector portion 150 is reflected back into the resonance cavity and another portion of the light is transmitted out of a corresponding facet of integrated laser 100.

Gain medium portion 120 is a portion of the integrated laser 100 that includes an active region. The active region of the gain medium portion 120 can have, for example, a gain structure that produces high power light (e.g., more light than that produced by a stripe-shaped gain structure). For example, the active region of the gain medium portion 120 can be a double-tapered structure described in U.S. patent application entitled "Light Emitting Semiconductor Device", Ser. No. 09/396,575, which is incorporated herein by reference; and U.S. patent application entititled "Multiple-Wavelength Mode-Locked Laser", Ser. No. 09/396,597, which is incorporated herein by reference.

Mode expander portion 130 is a portion of the integrated laser 100 that transfers light from the gain medium portion 120 into the single-mode waveguide portion 140 of the integrated laser 100. For example, the portion of the single-mode waveguide portion 140 in which light propagates can have a higher cross-sectional area than the portion of the gain medium portion 120 in which light propagates; in such an instance, the mode expander portion 130 can transfer light from the gain medium portion 120 into single-mode waveguide portion 140 while allowing the light to expand in cross-sectional size from the smaller cross-section of the gain medium portion 120 into the larger cross-section of the single-mode waveguide portion 140. In addition, the mode-expander portion 130 can allow the beam shape of the propagating light to change from a narrow oval shape when exiting the gain medium portion 120 to a more circular shape when exiting the output facet of the integrated laser 100. Examples of mode-expanders are disclosed in U.S. patent application entitled "Electrouminescent Diode with Mode Expander", Ser. No. 08/194,610, which is incorporated by reference; U.S. patent application entitled "Mode Expander with Co-directional Grating" which is incorporated by reference.

Single-mode waveguide portion 140 is a portion of integrated laser 100 that receives light from the mode expander portion 130 and sends light to the partial reflector portion 150. Single-mode waveguide portion 140 ensures that light send to the partial reflector portion 150 (and eventually output from the output facet of the integrated laser 100) maintains the fundamental mode. For example, gain medium portion 120 can generate light at a high power in such a manner that a portion of the light is in the fundamental mode and another portion of light is in higher order modes. As this light is coupled into the single-mode waveguide portion 140, only the light in the fundamental mode is transmitted through single-mode waveguide portion 140. Consequently, only light in the fundamental mode is allowed to oscillate within the resonance cavity and only light in the fundamental mode is output from the integrated laser 100.

Figure 4:
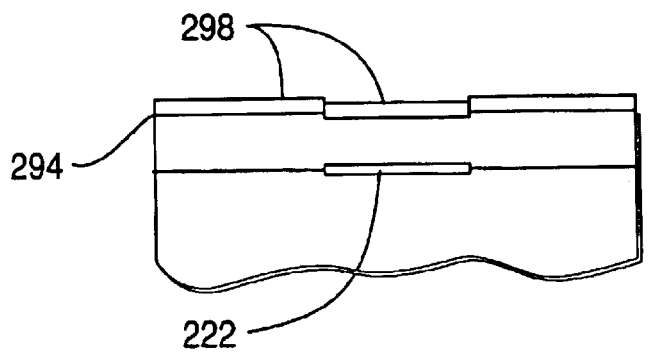
FIG. 4 illustrates a cross-sectional view along line AA of the integrated laser shown in FIG. 2.
Figure 5:
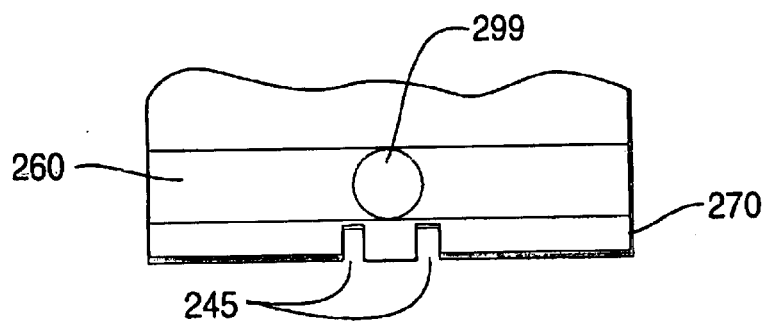
FIG. 5 illustrates a cross-sectional view along line BB of the integrated laser shown in FIG. 2.

FIG. 2 illustrates a top view of an integrated laser, according to an embodiment of the present invention. FIG. 3 illustrates a side view of the integrated laser shown in FIG. 2. FIG. 4 illustrates a cross-sectional view along line AA of the integrated laser shown in FIG. 2. FIG. 5 illustrates a cross-sectional view along line BB of the integrated laser shown in FIG. 2.

Integrated laser 200 includes reflector portion 210, gain medium portion 220, mode expander portion 230, single-mode waveguide portion 240 and partial reflector portion 250. As shown in FIG. 3, integrated laser 200 includes an active region 222 disposed within intermediate region 260 which is, in turn, disposed within outer region 270. One side of outer region 270 is adjacent to a substrate 280; the other side of outer region 270 is adjacent to a cap layer 290 (e.g., a p-cap layer), which is in turn adjacent to a dielectric layer 294, which is in turn adjacent to metal layer 298 (e.g., a p-metal layer).

The various layers of the integrated laser are formed so that a p-n junction is within the active region 222. To fabricate such a p-n junction, the layers on one side of the active region are p-doped and the layers on the other side of the active region are n-doped. In typical semiconductor lasers, the active region is undoped, but relatively thin. As shown in FIG. 3, p-metal 298 is only disposed over the gain medium portion 220 and at least a part of mode-expander portion 230, but not over the single-mode waveguide portion 240. This lack of p-metal over the single-mode waveguide portion 240 prevents unnecessary current to flow in the p-n junction in the single-mode waveguide portion 240 and shunting the active region 222. The doping in single-mode waveguide portion 240 can cause a small optical absorption in the single-mode waveguide portion 240; in an alternative embodiment, this optical absorption can be prevented by ion implant to disorder the material in the single-mode waveguide portion. In another embodiment, a separate p-metal layer (not shown in FIG. 3) can be disposed above the single-mode waveguide portion so that current can be applied independently to reduce the refractive index of that portion and obtain additional control of the waveguide characteristics.

Gain medium portion 220 includes at least a part of an active region 222. As shown in FIG. 2, for example, active region 222 includes a straight portion 224 and a central portion 226 within gain medium portion 220, and also includes a tapered portion 228 within the mode-expander portion 230. The straight portion 224 of active region 222 is disposed with the non-output facet of the integrated laser 200 and can have a length of, for example, 25 to 30 $\mu$m, and can have parallel walls to maximize reflection at the non-output facet. Note that high power density need not be a concern due to the relatively large cross-section of the electromagnetic field at the output facet of the integrated laser.

In an alternative embodiment, the active region does not include a straight portion and, rather, the extended portion can taper to a tip towards the reflector portion of the integrated laser (i.e., the non-output facet of the integrated laser). In yet another alternative embodiment, the tapered portion of the active portion can be, in part, within the gain medium portion and, in part, within the mode-expander portion. As shown in FIGS. 2 and 3, active region 222 of gain medium portion 220 can be aligned perpendicular to the facets of integrated laser 200 corresponding to reflector portion 210 and partial reflector portion 250.

Active region 222 is disposed within intermediate region 260 which has a refractive index less than the refractive index of the active region 222. Intermediate region 260 is disposed with outer region 270 which has a refractive index less than the refractive index of the intermediate region 260. For example, active region 222 can have a refractive index of 3.4; intermediate region 260 can have a refractive index of 3.38; outer region 270 can have a refractive index of 3.36.

Single-mode waveguide portion 240 includes at least a part of grooves 245 disposed within a portion of the outer region 270. For exanple, as shown in FIGS. 2, 3 and 5, grooves 245 can be disposed within a portion of the outer region 270 so that the effective refractive index of the corresponding portion of the intermediate region 270 is reduced. In other words, the grooves 245 in the outer region 270 reduces the effective refractive index in the intermediate portion 260 to provide a refractive index step. Consequently, light 299 propagating within the intermediate region 260 in single-mode waveguide portion 240 is laterally confined (e.g., in the horizontal direction as shown in FIG. 5 for illustration purposes).

Said another way, light 299 is not only confined vertically (e.g., in the 20 vertical direction as shown in FIG. 5 for illustration purpose) within the intermediate region 260 which acts as a core having a refractive index greater than that of the outer region 270 which acts a cladding. Rather, light 299 is also confined laterally within the intermediate region 260; grooves 245 in outer region 270 produce a refractive step within intermediate region 260: one portion of intermediate region 260 has a refractive index greater than the effective refractive index of the adjacent portions of intermediate region 260 that correspond to the location of grooves 245 in outer region 270. Thus, light 299 propagates within the portion of the intermediate region 260 which acts as a core while the adjacent portions of the intermediate region having a lower effective refractive index act as a cladding.

The dimensions of the intermediate region 260, and the location and dimensions of grooves 245 within the outer region can be selected so the dimensions of the portion of the intermediate region 260 acting as a core (in two directions) is controlled. More specifically, the dimensions of the portion of the intermediate region 260 acting as a core can be selected to maintain the propagating light 299 in the fundamental mode. For example, the particular depth of the grooves 245 can be controlled by the etching process.

Note that the references to a "vertical direction" and a "lateral direction" are for convenience of discussion, for example, in reference to the figures. These terms are not intended to limit particular orientation of an integrated laser.

Mode-expander portion 230 includes the tapered portion 228 of the active region 222, a portion of the intermediate region 260 and a portion of the outer region 270. Mode-expander portion 230 allows the light propagating in the active region 222 to be transferred into the intermediate region 260 in mode-expander portion 260 (and remain in the intermediate region 260 while in the single-mode waveguide portion 270). Of course, any light that is reflected by the partial reflector portion 280 is coupled back into the active region 222 from the intermediate region 260 in the mode-expander portion 260.

Light propagating within the tapered portion 228 towards the partial reflector portion 250 is coupled into the intermediate region 260 due to the tapered shape of tapered portion 228 of active region 222. If the taper of the tapered portion 228 has a small angle, for example of the order of one degree, and if the taper extends over several hundred wavelengths (of the propagating light), then coupling over ninety percent of the light from the active region 222 into the intermediate region 260 is possible.

In gain medium portion 220, the straight portion 224 and the expanded portion 226 both act as a core and the intermediate region 260 in gain medium portion 220 acts as a cladding due to the differences in the refractive indices (i.e., the refractive index of the straight portion 224 and the refractive index of the expanded portion 226 are greater than the refractive index of the intermediate portion 260). In the mode-expander portion 230, however, the tapered shape of the tapered portion 228 couples the light into the intermediate region 260 so that the intermediate region 260 acts as a core and the outer region acts as a cladding (again, because the refractive index of the intermediate region 260 is greater than the refractive index of the outer region 270). The same occurs single-mode waveguide portion 280 where the intermediate region 260 acts as a core and the outer region acts as a cladding.

Note that although active region 260 is shown in FIG. 3 as being disposed symmetrically within intermediate region 270, the active region 260 need not be so disposed. In other words, active region 260 can be disposed within intermediate region 270 so that a portion of intermediate region 270 on one side of active region 260 has a different size than portion of intermediate region 270 on the other side of active region 260. The specific size of the intermediate region 270 around active region need only be sufficient in size to maintain waveguide-like propagation of light within the straight portion 224 and central portion 226 of the active region 220. Similarly, although intermediate region 270 is shown in FIG. 3 as being disposed symmetrically within outer region 280, the intermediate region 270 need not be so disposed. The specific size of the outer region 280 around intermediate region 270 need only be sufficient in size to maintain waveguide-like propagation of light within the single-mode waveguide portion 240.

The tapered portion 228 of the active region 222 can be tapered both thickness and in width (shown in FIGS. 3 and 2, respectively). Fabricating a structure can be performed by three material growth steps and two processing sequences. In the first growth step, the two n-clad layers (e.g., portion of the intermediate region 260 and outer region 270 between the active region 222 and the substrate 280) can be performed. In the second growth step, the active region 222 with the thickness taper can be performed via epitaxal growth using appropriate SiO2 masks to modify the growth rate in the tapered region 228. This can be followed by a first processing step where a chemical etching is performed to shape the tapered portion 228 to a tip. This can be followed by a third growth step to fabricate the two p-clad layers above the active region (e.g., portion of the intermediate region 260 and outer region 270 between active region 222 and p-cap 290), and then the p-cap 290 can be fabricated. Note that the intermediate region 260 surrounds the active region 222 laterally as well. Finally, a second processing step is performed which involves etching grooves 245, depositing the dielectric material 294 and etching an opening in it matching the shape of the active region 222, depositing and etching the p-metal 298 as needed. This can be followed by cleaving, facet coating, and chip dicing.

In some embodiments, the tapered portion is tapered in width only. Fabricating such a device can involve only two growth steps and two processing steps. The active layer can be included in the first growth, and chemical etching can be used to shape the tapered portion of the active region. The second growth step involves the two p-clad and the p-cap, and the second processing step is as described above. In this embodiment were the tapered portion is symmetrical in thickness, the electromagnetic field of the propagating light can expand equally above and below the tapered portion of the active region.

Figure 6:
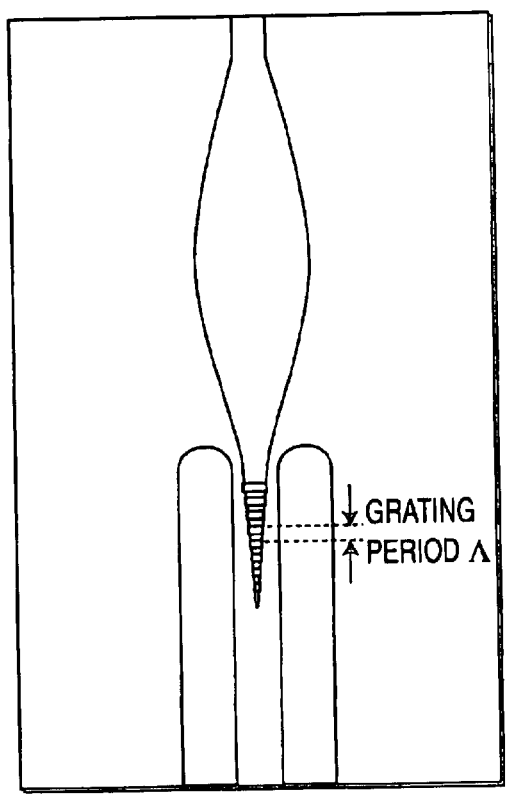
FIG. 6 illustrates a top view of an integrated laser having a co-directional grating in the tapered portion of the active region, according to an embodiment of the present invention.
Figure 7:
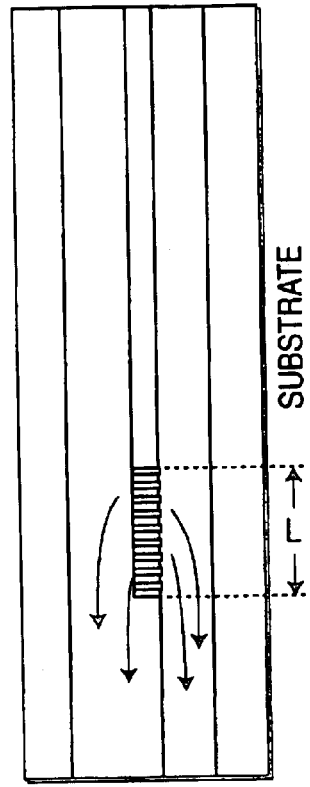
FIG. 7 illustrates a side view of the integrated laser shown in FIG. 6.

FIG. 6 illustrates a top view of an integrated laser having a co-directional grating in the tapered portion of the active region, according to an embodiment of the present invention. FIG. 7 illustrates a side view of the integrated laser shown in FIG. 6. In this embodiment, the tapered portion of the active region in mode-expander portion includes a co-directional grating. The fabrication of this embodiment avoids the complicated material growth described above in reference to a taper in thickness. This embodiment is described in detail in U.S. patent application entitled "Mode Expander with Co-directional Grating" which is incorporated by reference.

An integrated laser, according to embodiments of the present invention, has round-trip optical feedback to allow light within the laser to oscillate. For example, as shown in FIGS. 2 and 3, because the active region 222, intermediate region 260 and outer region 270 are perpendicular to the facets of the integrated laser 200, optical feedback can be provided by reflection by reflector portion 210 and partial reflector portion 250. In other embodiments, other structures can accomplish optical feedback.

Figure 8:
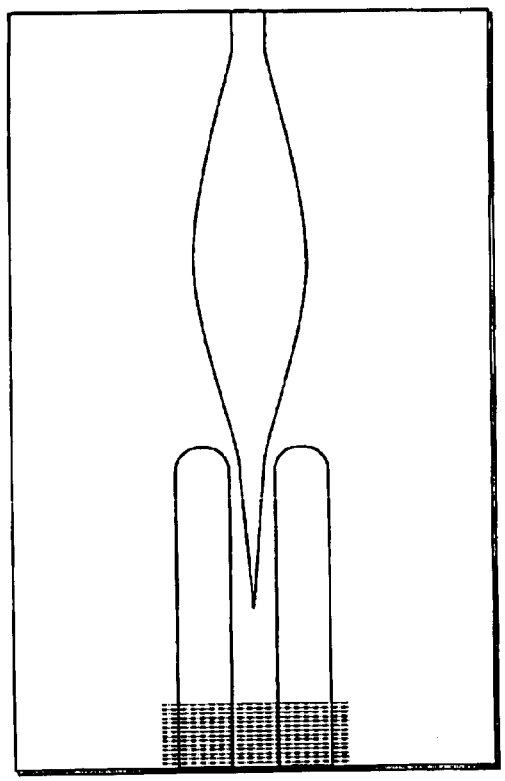
FIG. 8 illustrates a top view of an integrated laser having a grating disposed with the output facet of the laser, according to an embodiment of the present invention.
Figure 9:
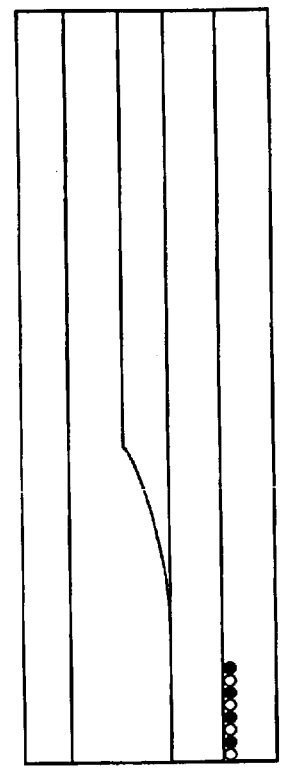
FIG. 9 illustrates a side view of the integrated laser shown in FIG. 8.
Figure 10:
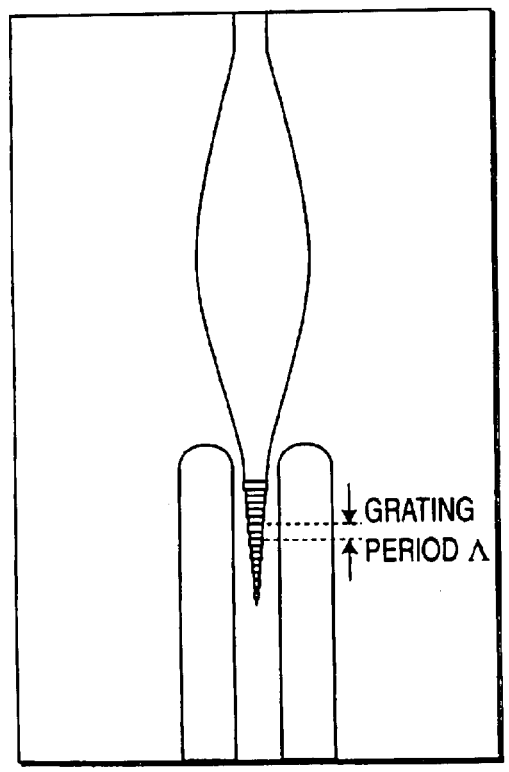
FIG. 10 illustrates a top view of an integrated laser having a grating disposed with the output facet of the laser and a co-directional grating in the tapered portion of the active region, according to an embodiment of the present invention.
Figure 11:
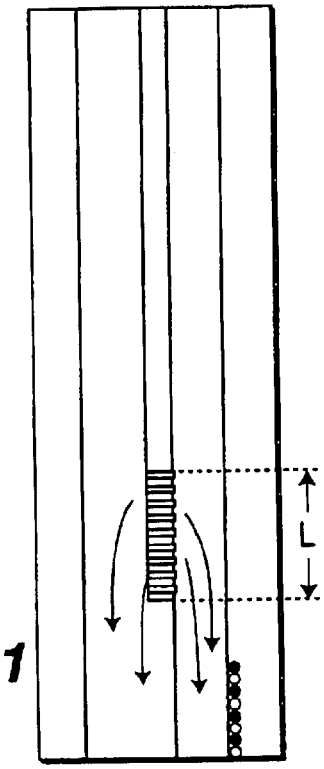
FIG. 11 illustrates a side view of the integrated laser shown in FIG. 10.

For example, in other embodiments, optical feedback is provided by a grating disposed at the output facet of an integrated laser, the non-output facet of an integrated laser, or both. FIG. 8 illustrates a top view of an integrated laser having a grating disposed with the output facet of the laser, according to an embodiment of the present invention. FIG. 9 illustrates a side view of the integrated laser shown in FIG. 8. FIG. 10 illustrates a top view of an integrated laser having a grating disposed with the output facet of the laser and a co-directional grating in the tapered portion of the active region, according to an embodiment of the present invention. FIG. 11 illustrates a side view of the integrated laser shown in FIG. 10. In such embodiments, the facet with a grating can have a reflectance on the order of one percent or less. A grating disposed at a facet of the laser advantageously provides wavelength stabilization for the laser by providing feedback only over a very narrow spectrum.

In yet another embodiment, a grating can be disposed within the single-mode optical fiber into which an integrated laser is coupled. This embodiment advantageously allows for wavelength selection by the appropriate choice of grating in the fiber. If the facet reflectance is of the order of one percent, a grating reflectance of five to ten percent is sufficient to negate any effect of facet feedback.

In yet another embodiment, portion of the integrated laser can be at an angle (e.g., six to eight degrees) with respective to the output facet of the integrated laser, rather than perpendicular as described in FIGS. 2–5. For example, in one such embodiment, a part of the gain medium portion, the mode-expander portion and the single-mode waveguide portion can be at an angle with respect to the output facet of the laser, thereby leaving a remaining part of the gain medium portion perpendicular to the non-output facet of the laser. In another embodiment, the single-mode waveguide portion only can be at an angle with respect to the output facet of the laser. In both embodiments, a bent having a radius of curvature can be present to maintain the core/cladding type of light propagation within mode-expander portion and the single-mode waveguide portion; embodiments having such a bent are discussed, for example, in U.S. patent application "High-Power Laser with Transverse Mode Filter", which is incorporated by reference.

Figure 12:
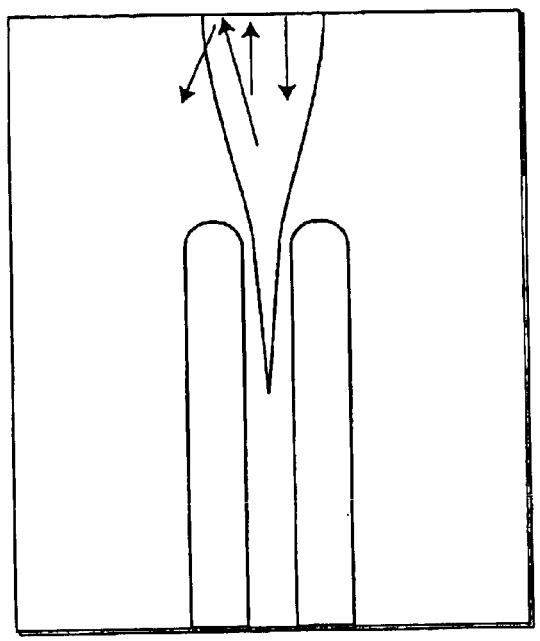
FIG. 12 illustrates a top view of an integrated laser having a truncatedshaped active region, according to an embodiment of the present invention.
Figure 13:
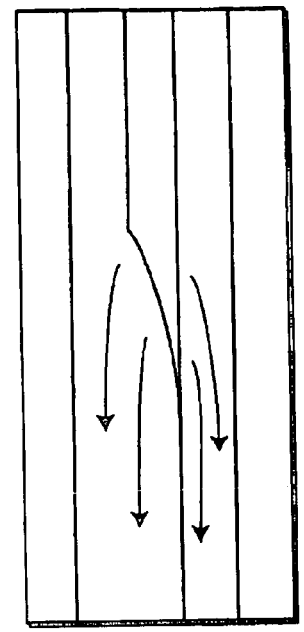
FIG. 13 illustrates a side view of the integrated laser shown in FIG. 12.

In yet other embodiments, only half of the active region of the gain medium portion is present. For example, FIG. 12 illustrates a top view of an integrated laser having a truncated-shaped active region, according to an embodiment of the present invention. FIG. 13 illustrates a side view of the integrated laser shown in FIG. 12. In such an embodiment, the waist of the expanded portion of the active region corresponds to the non-output facet of the laser. This non-output facet of the laser can have a high reflectance so that incident light is mostly reflected back into the gain medium portion. Note that only light incident perpendicularly on the non-output facet is reflected back into the expanded portion of the active region. The light obliquely incident on the non-output facet is reflected out of the laser. Thus, this embodiment acts as a natural filter for undesired modes. This embodiment can advantageously use less space on the wafer, thereby doubling the number of lasers produced on a given wafer. Note further that unlike known master oscillator power amplifiers (MOPAs) where the output facet is selected as the larger end of the active region, the embodiment shown in FIGS. 12 and 13 has the larger end of the active region is disposed at a non-output facet.

Figure 14:
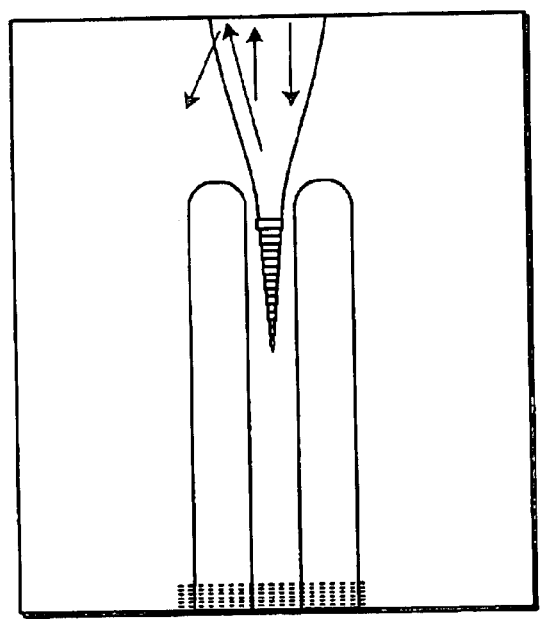
FIG. 14 illustrates a top view of an integrated laser having a truncatedshaped active region and a co-directional grating in the tapered portion of the active region, according to an embodiment of the present invention.
Figure 15:
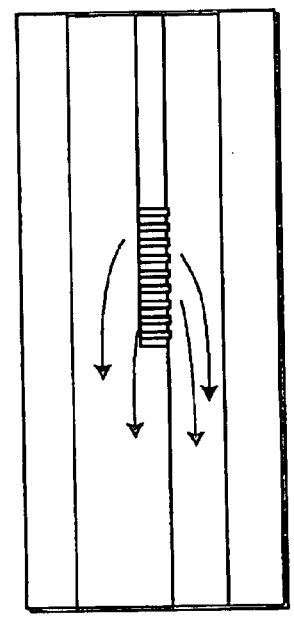
FIG. 15 illustrates a side view of the integrated laser shown in FIG. 14.

In yet other embodiments, several feature of the present invention can be combined in various ways. For example, FIG. 14 illustrates a top view of an integrated laser having a truncated-shaped active region and a co-directional grating in the tapered portion of the active region, according to an embodiment of the present invention. FIG. 15 illustrates a side view of the integrated laser shown in FIG. 14. In this embodiment, truncated-shaped active region, a co-directional grating in the tapered portion of the active region, and a grating disposed with the output facet of the laser are combined.

Figure 16:
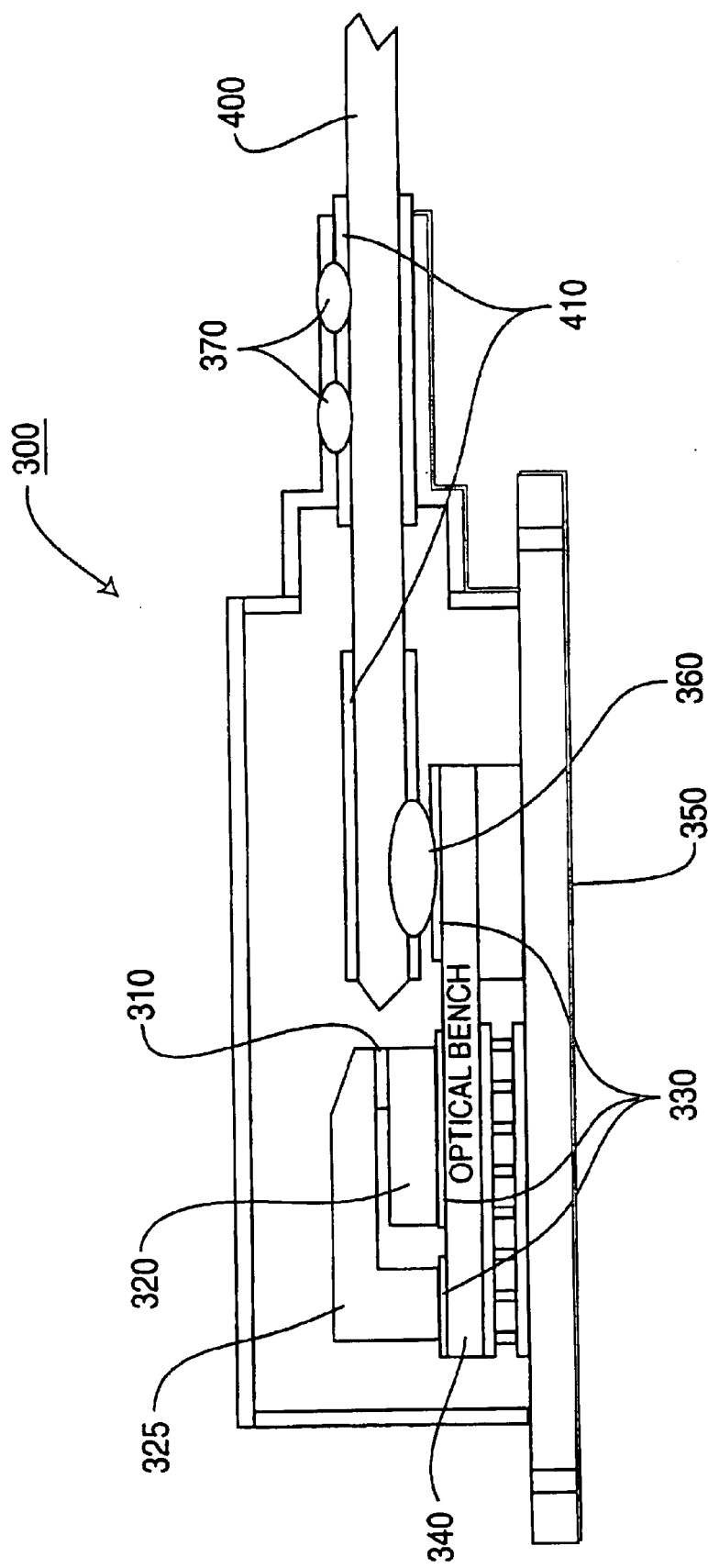
FIG. 16 illustrates a side view of an optical assembly having an integrated laser with a thermoelectric cooler and fiber pigtail, according to an embodiment of the present invention.

Embodiment of the present invention can be assembled and thermally managed by using a thermoelectric cooler (TEC) to which the integrated laser can be mounted by, for example, a low thermal resistance module. For example, FIG. 16 illustrates a side view of an optical assembly having an integrated laser with a TEC and fiber pigtail, according to an embodiment of the present invention. Optical assembly includes integrated laser 310 mounted by low $R^{th}$ p-metal block 320 and low $R^{th}$ n-metal block 325. Low $R^{th}$ p-metal block 320 and low $R^{th}$ n-metal block 325 are mounted metal traces 330 which are in turn mounted to miniature optical bench 340. The TEC is mounted between the other side of the optical bench 340 and package 350 which can be, for example, a standard 14-pin dip or butterfly package. Optical fiber pigtail 400 is metallized (e.g., metallization 410) so that its tip can be welded (e.g., weld 360) in place in front of the integrated laser 310, and soldered (e.g., solder 370) through openings in the package 350 for hermetic sealing.

It should, of course, be understood that while the present invention has been described in reference to particular configurations, other configurations should be apparent to those of ordinary skill in the art. For example, although the integrated laser is described as having a slab-like waveguide structure, other waveguide structures, such as a cylindrical waveguide structure, as possible.

What is claimed is:

1. A single-transverse-mode laser having a resonance cavity with an output end, comprising:
    a gain medium portion disposed within the resonance cavity, wherein said gain medium portion includes an active portion;
    a mode expander portion disposed within the resonance cavity between and operationally coupled to said gain medium portion and the output end of the resonance cavity; and
    a single-mode waveguide portion disposed within the resonance cavity between and operationally coupled to said mode expander portion and the output end of the resonance cavity, said single mode waveguide portion being a passive portion, said gain medium portion, said mode expander portion and said single-mode waveguide portion being integrally formed, wherein said gain medium portion includes a first portion of an active laver, said mode expander portion includes a second portion of the active laver, and an end of the second portion of the active laver closest to the output end of the resonance cavity has a tapered shape along a propagation axis.

2. The single-transverse-mode laser of claim 1, wherein said gain medium portion includes a first portion of a first layer and first portion of a second layer, said mode expander portion includes a second portion of the first layer and a second portion of the second layer, said single-mode waveguide portion includes the second portion of the first layer and the second portion of the second layer, light within said gain medium propagates within the first portion of the active layer, light within said mode expander portion propagates within the second portion of the first layer and within the second portion of the active layer, and light within said single-mode waveguide propagates within the second portion of the first layer.

3. The single-transverse-mode laser of claim 1, wherein said mode expander portion couples light from an the active layer of said gain medium portion to a first layer of said single-mode waveguide portion.

4. The single-transverse-mode laser of claim 1, wherein said gain medium portion includes a first portion of a first layer and a first portion of a second layer, the first portion of the active layer is disposed between the first portion of the first layer and the first portion of the second layer, said mode expander portion includes a second portion of the first layer and a second portion of the second layer, the second portion of the active layer is disposed between the second portion of the first layer and the second portion of the second layer, said mode expander portion evanescently couples light from the second portion of the active layer into the second portion of the first layer and the second portion of the second layer.

5. A single-transverse-mode laser having a resonance cavity with an output end, comprising:
    a gain medium portion disposed within the resonance cavity, said gain medium portion includes an active portion;
    a mode expander portion disposed within the resonance cavity between and operationally coupled to said gain medium portion and the output end of the resonance cavity; and
    a single-mode waveguide portion disposed within the resonance cavity between and operationally coupled to said mode expander portion and the output end of the resonance cavity, said single-mode waveguide portion being a passive portion, said gain medium portion, said mode expander portion and said single-mode waveguide portion being integrally formed, wherein said gain medium portion includes a first portion of an active layer, said mode expander portion includes a second portion of the active layer, and an end of the second portion of the active layer closest to the output end of the resonance cavity has a co-directional grating, the co-directional grating has a length that is a function of a propagatiion characteristic of the active layer and a propagation characteristic of a first layer disposed adjacent to the active layer, the co-directional grating has a grating period, a propagation characteristic of the active layer substantially matching a propagation characteristic of the first layer plus two times $\pi$ divided by the grating period.

6. The single-transverse-mode laser of claim 1, wherein:
said single-mode waveguide portion includes a first layer, a second layer and a third layer, the second layer is disposed between the first layer and the third layer, the third layer includes a first groove and a second groove, the third layer associated with the first groove and the second groove having an effective refractive index less than the refractive index of remaining portions of the third layer and less than the refractive index of the first layer.

7. The single-transverse-mode laser of claim 6, wherein:
a dimension of the third layer in a first direction defines an output spot size in the first direction associated with a single-transverse mode; and
the first groove and the second groove of the third layer define an output spot size in a second direction associated with a single-transverse mode.

8. The single-transverse-mode laser of claim 7, wherein:
the first groove and the second groove of the third layer each have a depth that defines an effective refractive index of the third layer associated with the first groove and the second groove sufficient to define an output spot size in a direction associated with a single-transverse mode.

9. The single-transverse-mode laser of claim 1, wherein:
said gain medium portion has a centerline perpendicular to a facet defining an end of the resonance cavity;
said gain medium further having a straight portion adjacent to an end of the double-tapered structure.

10. The single-transverse-mode laser of claim 1, wherein:
said gain medium portion includes a body having a first side surface, a second side surface, and a top surface, said body including an active layer for generating light;
the double-tapered structure being within the body, the double-tapered structure having a first segment and a second segment;
the width of the double-tapered structure is defined by the distance between said first and second segments;
said first and second segments each extend from the first side surface to the second side surface of said body;
said first and second segments of the double-tapered structure are substantialty non-parallel;
said first and second segments of the double-tapered structure are separated by a distance at the first and second side surfaces of said body to form respective first and second double-tapered structure ends; and
the width of said first and second double-tapered structure ends are each less than the width of said double-tapered structure intermediate said first and second double-tapered structure ends.

11. An integrally formed single-transverse mode laser, comprising;
an active region having a refractive index and having a first portion and a second portion, the first portion of said active region having an extended structure, the second portion of said active region having a co-directional grating;
an intermediate region having a refractive index less than the refractive index of said active region, said intermediate region having a first portion, a second portion, and a third portion, the first portion of said active region being disposed within the first portion of said intermediate region, the second portion of said active region being disposed within the second portion of said intermediate region; and
an outer region having a refractive index less than the refractive index of said intermediate region, said outer region having a first portion and a second portion, said intermediate region being disposed within the first portion of said outer region,
wherein the second portion of said outer region includes a first groove and a second groove, a section of the second portion of said outer region associated with the first groove and the second groove having an effective refractive index less than the refractive index of remaining section of said outer region and less than the refractive index of said intermediate region.

12. The integrally-formed single-transverse mode laser of claim 11 wherein;
the first groove and the second groove of said outer region define an output spot size in the second direction associated with a single-transverse mode; and
a dimension of said outer region in the first direction defines an output spot size in the first direction associated with a single-transverse mode.

13. The integrally-formed single-transverse mode laser of claim 11 wherein; the first groove and the second groove of said outer region each have a depth that defines an effective refractive index of said outer region associated with the first groove and the second groove sufficient to defines a dimension of an output spot size in the second direction associated with a single-transverse mode.

14. The integrally-formed single-transverse-mode laser of claim 11, wherein: the double-tapered structure of said active region being align with a centerline perpendicular to a facet defining an end of the laser.

15. An optical system, comprising:
an integrally-formed, single mode laser having an output wavelength and an output spot size with a first dimension and a second dimension at an output face of said laser, the first dimension of the output spot size corresponding to a single-transverse mode for the output wavelength, the second dimension of the output spot size corresponding to a single transverse mode for the output wavelength;
and an optical fiber operatively coupled with said single-mode laser without intervening optical elements,
wherein said laser includes:
a mode expander portion; and
a single-mode waveguide portion operatively coupled with said mode expander portion, said single mode waveguide portion being disposed between said mode expander portion and the output face of said laser,
said mode expander portion being adapted to evanescently couple light from an active laver of said laser into a first clad layer of said single mode waveguide.

16. The optical system of claim 15, further comprising:
a thermoelectric cooler coupled to a first side of said laser and a second side of said laser.

17. The optical system of claim 15, herein said laser includes a grating reflector disposed within the single-mode waveguide portion at the output face of said laser.

* * * * *